(12) United States Patent
Andersson

(10) Patent No.: US 6,658,028 B1
(45) Date of Patent: Dec. 2, 2003

(54) METHOD OF WAVELENGTH LOCKING AND MODE MONITORING A TUNEABLE LASER

(75) Inventor: Lars Andersson, Järfälla (SE)

(73) Assignee: Altitun AB, Jarfalla (SE)

( * ) Notice: Subject to any disclaimer, the term of this patent is extended or adjusted under 35 U.S.C. 154(b) by 0 days.

(21) Appl. No.: 09/913,846
(22) PCT Filed: Feb. 15, 2000
(86) PCT No.: PCT/SE00/00293
§ 371 (c)(1),
(2), (4) Date: Jan. 2, 2002
(87) PCT Pub. No.: WO00/49693
PCT Pub. Date: Aug. 24, 2000

(30) Foreign Application Priority Data

Feb. 17, 1999 (SE) .............................................. 9900537

(51) Int. Cl.⁷ .............................................. H01S 3/098
(52) U.S. Cl. .............................. 372/18; 372/19; 372/98; 372/29.023; 372/29.021; 372/29.015
(58) Field of Search .................. 372/18, 9, 98, 372/29.021, 29.023, 29.015, 38.07

(56) References Cited

U.S. PATENT DOCUMENTS

| | | | | |
|---|---|---|---|---|
| 5,473,625 A | * | 12/1995 | Hansen et al. ................. | 372/96 |
| 5,541,945 A | * | 7/1996 | Yamaguchi et al. ........... | 372/20 |
| 5,581,572 A | * | 12/1996 | Delorme et al. .............. | 372/50 |
| 5,732,102 A | * | 3/1998 | Bouadma ...................... | 372/96 |
| 5,789,274 A | * | 8/1998 | Yamaguchi et al. ........... | 438/32 |
| 5,832,014 A | * | 11/1998 | Johnson ........................ | 372/32 |
| 6,064,681 A | * | 5/2000 | Ackerman .................... | 372/32 |
| 6,192,058 B1 | * | 2/2001 | Abeles .......................... | 372/6 |
| 6,215,804 B1 | * | 4/2001 | Sahlen et al. ................. | 372/50 |
| 6,321,003 B1 | * | 11/2001 | Kner et al. .................... | 385/24 |
| 6,333,263 B1 | * | 12/2001 | Ngo et al. ................... | 438/669 |
| 6,359,915 B1 | * | 3/2002 | Koch et al. ............. | 372/29.02 |
| 2002/0015433 A1 | * | 2/2002 | Zimmermann ............... | 372/96 |
| 2002/0067540 A1 | * | 6/2002 | Delprat et al. ............... | 359/344 |

FOREIGN PATENT DOCUMENTS

| | | |
|---|---|---|
| EP | 0 529 732 | 3/1993 |
| EP | 0 774 684 | 5/1997 |

* cited by examiner

*Primary Examiner*—Leon Scott, Jr.
(74) *Attorney, Agent, or Firm*—Altera Law Group, LLC

(57) ABSTRACT

A method of wavelength locking and mode monitoring a tuneable laser that includes two or more tuneable sections in which injected current can be varied, including at least one reflector section and one phase section. Laser operation points are determined as different current combinations through the different laser sections, and the laser operates at a predetermined operation point. The wavelength of light emitted by the laser is detected by a wavelength selective filter. The laser is controlled in an iterative process in which alternated currents through the reflector section and, when applicable, its coupler section, and the current through the phase section are adjusted. The currents through the reflector section and the coupler section are adjusted to obtain a minimum ratio between power rearwards and power forwards. The current through the phase section is adjusted to hold the wavelength constant, the wavelength being measured against a wavelength reference.

10 Claims, 2 Drawing Sheets

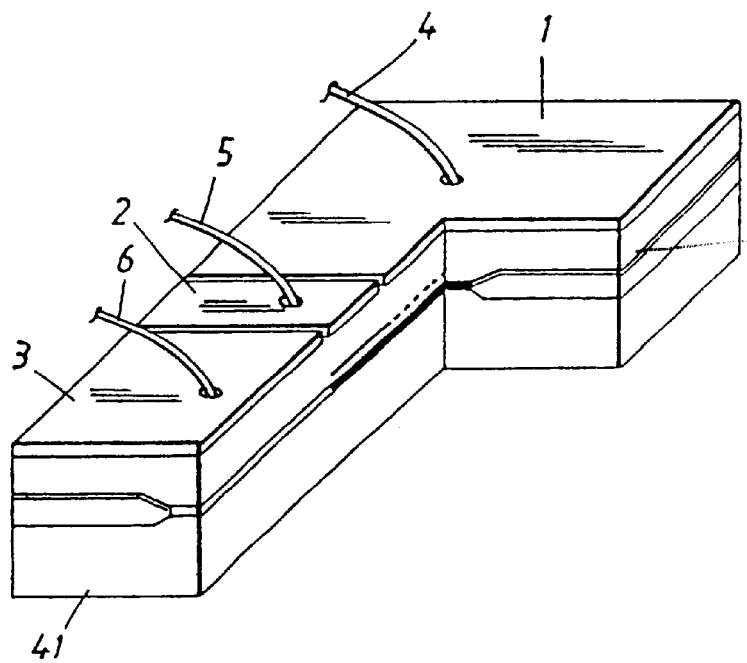
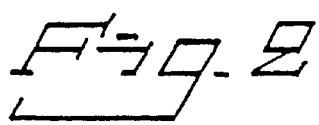
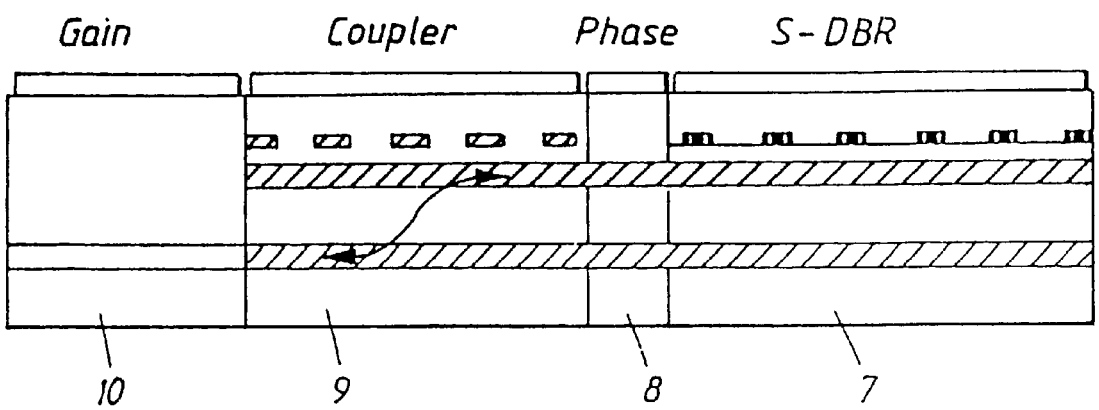

METHOD OF WAVELENGTH LOCKING AND MODE MONITORING A TUNEABLE LASER

BACKGROUND OF THE INVENTION

1. Field of the Invention

The present invention relates to a method of wavelength locking and mode monitoring a tuneable laser. The invention also includes a method of compensating for laser degradation.

2. Description of the Related Art

Tuneable semiconductor lasers have a number of different sections through which current is injected, typically three or four such sections. The wavelength, power, and mode purity of the lasers can be controlled by adjusting the current in the various sections. Mode purity implies that the laser is at an operation point, i.e., in a combination of the three or four injected drive currents at which the laser is distanced from a combination of the drive currents where so-called mode jumps take place and where lasing is stable and side mode suppression is high.

Special wavelength controls are required with different applications. In the case of telecommunications applications, it is necessary that the laser retain its wavelength to a very high degree of accuracy and over very long periods of time, after having set the drive currents and the temperature. A typical accuracy in this respect is 0.1 nanometer and a typical time period is 20 years.

In order to be able to control the laser, it is necessary to map the behavior of the laser as a function of the various drive currents. This is necessary prior to using the laser after its manufacture.

It would also be very beneficial to lock the wavelength of a laser and ensure that the mode at which the laser operates can be controlled, so that the laser will operate as intended over a long period of time. By mode control is meant that when the laser is in use, either continuously or at regular intervals, the operation point of the laser can be optimized so as to exclude the risk of a mode jump to some other cavity mode. It would also be very beneficial to be able to automatically compensate operating lasers for degradation of the laser.

The present invention satisfies these desires.

SUMMARY OF THE INVENTION

The present invention thus relates to a method of locking the wavelength and monitoring the mode of a tuneable laser that includes two or more tuneable sections in which injected current can be varied, and of which sections at least one is a reflector section and one is a phase section. The laser will have been characterized with respect to suitable laser operation points which have been determined as different current combinations through different laser sections. The laser operates at a predetermined, selected operation point. The wavelength of the light emitted by the laser is detected with the aid of a wavelength-selective filter, and the laser is controlled in an iterative process in which alternated current through the reflector section of the laser, and at times the coupler section and the current through the phase section of said laser, is adjusted. The currents through the reflector section and the coupler section are adjusted to obtain a minimum in the relationship between power back and power forwards. The current through the phase section of the laser is adjusted so that the wavelength will be held constant, wherein the wavelength is measured against a wavelength reference.

BRIEF DESCRIPTION OF THE DRAWINGS

The invention will now be described in more detail partly with reference to exemplifying embodiments thereof and partly with reference to the accompanying drawings, in which FIG. 1 is a perspective, partially cut-away view of a DBR laser;

FIG. 2 is a sectional view of a tuneable Grating Coupled Sampled Reflector (GCSR) laser;

DESCRIPTION OF THE PREFERRED EMBODIMENTS

Figure 3:
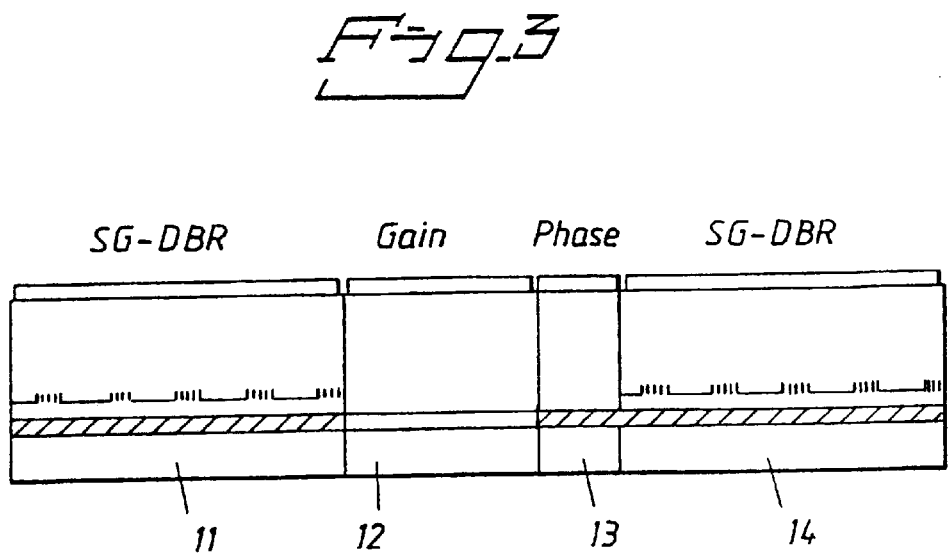
FIG. 3 is a sectional view of a Sampled Grating DBR laser.

Shown in FIG. 1 is a DBR laser which includes three sections, namely a Bragg reflector 1, a phase section 2, and a gain section 3. Each section is controlled by injecting current into respective sections through respective electric conductors 4, 5, 6.

FIG. 2 is a sectional view of a tuneable Grating Coupled Sampled Reflector (GCSR) laser. Such a laser includes four sections, i.e., a Bragg reflector 7, a phase section 8, a coupler 9 and again section 10. Each of the sections is controlled by injecting current into the respective sections.

FIG. 3 is a sectional view of a Sampled Grating DBR laser that also includes four sections 11, 12, 13, 14, of which sections 11 and 14 are Bragg reflectors, section 13 is the phase section, and section 12 is the gain section.

These three laser types are common, although other types of lasers exist.

Although the invention is described below essentially with reference to a GCSR laser according to FIG. 2, it will be understood that the invention is not restricted to any particular type of tuneable semiconductor laser, but can be applied correspondingly with tuneable lasers other than those illustrated by way of example in the drawings.

Figure 4:
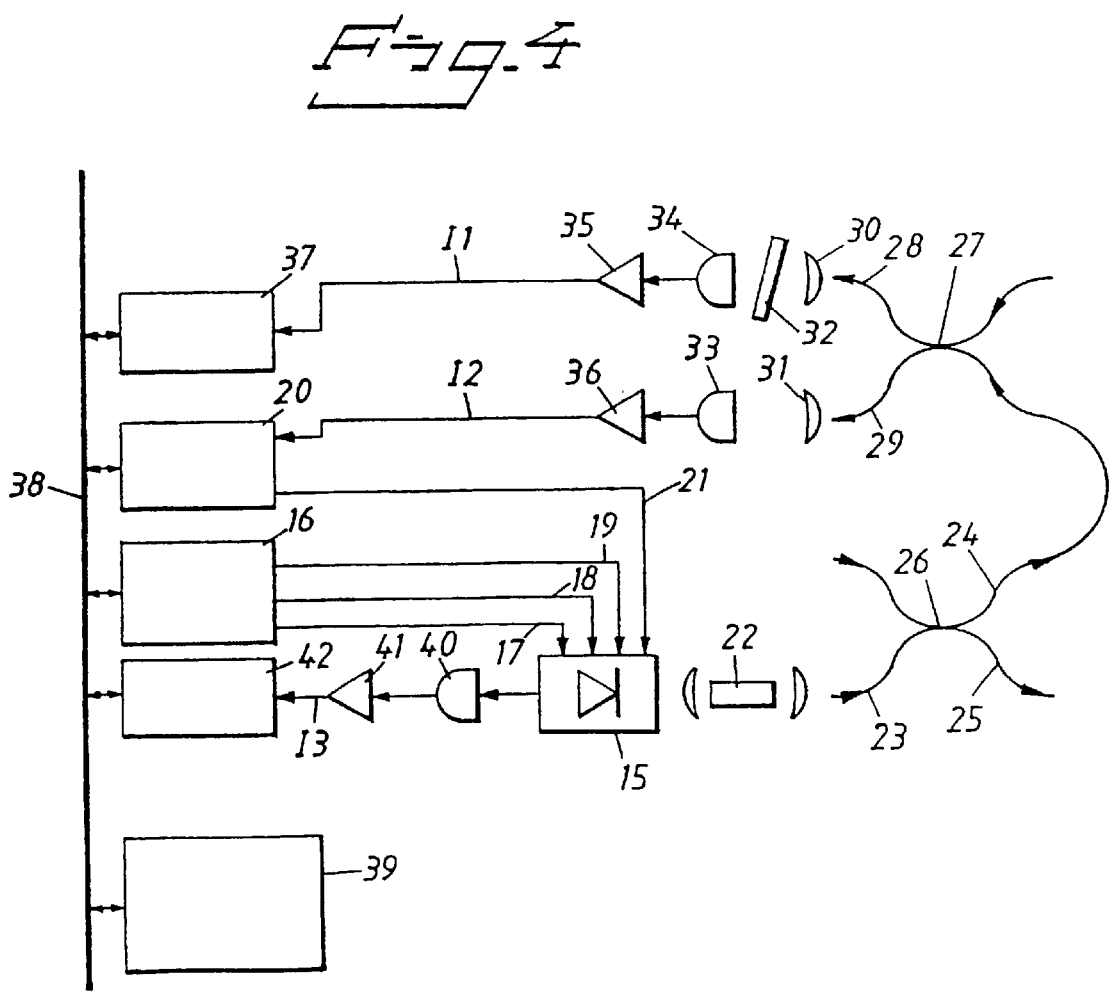
FIG. 4 is a schematic block diagram of an arrangement used in accordance with the invention.

FIG. 4 is a block diagram of an arrangement used with the present invention. The numeral 15 identifies a GCSR laser while the numeral 16 identifies current generators for injecting current into the reflector section, the phase section and the coupler section, respectively, of the laser, through respective conductors 17, 18, and 19. The power of the laser is controlled to its gain section, by means of a power regulating circuit 20 via a conductor 21.

The laser emits light from the front mirror to a light conductor 23, e.g., a fiber optic, via a lens pack 22. The light conductor conducts the light to a light divider or splitter 26 which switches part of the light to another light conductor 24. The remainder of the light is conducted in the conductor 25. The light divider or splitter 26 switches for instance 10% of the light from the conductor 23 to the conductor 24.

The light conductor 24 conducts the light to another light splitter 27 which functions to divide the light equally between two light conductors 28, 29. A lens 30, 31 is provided at respective ends of the light conductors 28, 29. A wavelength filter 32, which functions as a wavelength reference, and which can be a Fabry-Perot filter, is provided in the light path downstream of the lens 30.

Provided downstream of the lens 31 is a first detector 33, while a second detector 34 is provided downstream of the Fabry-Perot filter 32. The detectors 33, 34 are intended to measure the power of the light and to deliver a corresponding detector signal to an A/D converter 37, via a respective amplifier 35, 36.

The A/D converter 37, the power regulating circuit 20, and the current generator 16 are all connected to a microprocessor 39, via a data bus 38. The microprocessor is adapted to control the current generators and the power regulating circuit in a desired, known manner and in response to the signals from the A/D converter 37 and the power regulating circuit 20.

The arrangement also includes a monitor diode 40 which is placed at the rear mirror of the laser and which is adapted to measure light that is emitted rearwardly by the laser. The detected light results in a signal I3 that is led via an amplifier 41 to an A/D converter 42, whose output signal is delivered to the microprocessor 39.

Thus, the present invention relates to a method of wavelength-locking and mode-monitoring a tuneable laser 15, which has been characterized with respect to suitable laser operation points which have been determined as different current combinations through the various laser sections with the laser operating in a predetermined, chosen operation point.

According to the invention, the power of the forwardly- and rearwardly-emitted laser light is measured and a part of the forwardly-emitted light is detected with respect to its wavelength, by means of a wavelength selective filter.

According to the invention, part of the forwardly-emitted light is led to the first detector 33, and also to the second detector 34 via a wavelength selective filter 32.

According to the invention, the laser 15 is controlled in an iterative process, in which alternated current through the reflector section of the laser and, when applicable, through the coupler section thereof, and the current through the phase section of said laser are adjusted so as to hold the wavelength constant and so as to lock the mode of the laser. This is effected by adjusting the currents 17, 19 through the reflector section and the coupler section so as to obtain a minimum with respect to the relationship between the rearward power 13 and the forward power 11, at the same time as the current through the phase section of said laser is adjusted so as to maintain a constant wavelength. The wavelength is measured against a wavelength reference.

By current control is meant in this document that the current through the sections is controlled by current generators, or, alternatively, the current through the sections is controlled by controlling the voltage across the sections.

In the case of the FIG. 4 embodiment, the first detector 33, the second detector, 34, and the Fabry-Perot filter 32 are placed in the proximity of the front mirror of the laser. By way of an alternative, these components may just as well be placed in the proximity of the rear mirror of said laser, wherewith light emitted from said rear mirror is used to determine the wavelength.

According to one preferred embodiment, the wavelength reference includes a Fabry-Perot filter 32 which has a certain transmission for each wavelength that is included in a channel plane containing desired wavelengths and exhibiting transmission which deviates therefrom in respect of other wavelengths.

According to one preferred embodiment of the inventive method, part of the light emitted forwardly by the laser 15 is led to a first detector 33 on the one hand and to a second detector 34 via a Fabry-Perot filter 32 on the other hand. A monitor diode 40 is placed at the rear mirror of the laser 15, for measuring rearwardly-emitted laser light. The detectors 33, 34, 40 are adapted to measure the power of the light in a known manner, and to deliver a respective detector signal I2, I1, I3. The currents through the reflector and coupler sections 17, 19 are adjusted so that the ratio I3/I2 between the detector signal from the monitor diode 40 and the first detector 33 is caused to take a minimum value at the same time as the current through the phase section 18 is adjusted so that the ratio I1/I2 between the detector signal from the second detector 34 and the first detector 33, respectively, lies within a predetermined interval, meaning that the emitted light will lie within one of a number of wavelengths given by the Fabry-Perot filter 32.

It is preferred that the filter is a so-called Fabry-Perot filter. Such a filter is well known and need not therefore be described in detail in the present case. The Fabry-Perot filters can be designed so as to transmit light solely of certain wavelengths, normally wavelengths that are multiples of a given wavelength. The Fabry-Perot filter has a deviating lower or higher transmission at other wavelengths.

The Fabry-Perot filter and the first and the second detector may be arranged relative to one another in a manner different from that shown in FIG. 4, such as to detect at least wavelengths. The first and the second detector can be adapted to measure light transmitted through the Fabry-Perot filter and/or light reflected onto the Fabry-Perot filter, so as to detect wavelengths.

Alternatively, there may be used a broadband wavelength filter where a level of one edge of the filter is sensed in a known manner, so as to sense the wavelength.

The iterative process thus means that firstly reflector current and coupler current are adjusted, for instance, so as to mode lock the laser, whereafter the phase current is adjusted so as to obtain the correct wavelength. Thereafter, the reflector current and the coupler current are again adjusted, followed by an adjustment to the phase current, and so on, until the ratio between the different powers measured lies within predetermined ranges. The laser is considered to deliver the correct wavelength in the correct mode, where the ratios lie within the predetermined ranges.

The above method can be greatly simplified, if the forwardly-emitted power is kept constant.

It is therefore preferred that the signal from the first detector 33 is delivered to a power regulating circuit 20, which is adapted to cause the laser 15 to deliver light having a constant power output during the iterative process.

In order to hold the forwardly-emitted power constant, it is necessary to minimize the rearwardly-emitted power so that an optimum operation point, i.e., mode locking, is achieved, under the further condition that the wavelength is held locked.

Instead of measuring light emitted from both the front mirror and the rear mirror, the light emitted in solely one of these directions can be measured when the voltage across the gain section is measured. This voltage can be used together with the power of the emitted light to monitor the mode of the laser, instead of measuring light emitted from both the rear mirror and front mirror. Thus, a minimum with respect to the ratio between the rearwardly-emitted power and the forwardly-emitted power can be obtained from said voltage and the power of the light emitted at one of the mirrors.

The present invention can be applied to measure laser degradation, and to calculate the tuning currents for the different operation points of a degraded laser.

According to one highly preferred embodiment to this end, the currents through the tuning sections are adjusted so that the laser will deliver the initially set wavelength at the same time as it lases in the initially set mode, whereafter the quotient between initial current and the current concerned is calculated for respective tuning sections. This provides a very good measurement of laser degradation. These quotients are then used to rescale the currents of all other operation points so as to therewith achieve adjusted operation points.

The present invention thus solves the problems mentioned in the introduction.

Although the invention has been described above with reference to various embodiments and also in conjunction with a GCSR laser, it will be obvious that the structural design of the described arrangement can be varied while achieving the same result. The invention can also applied to lasers of a type different to GCSR lasers.

The present invention is therefore not restricted to the aforedescribed and illustrated exemplifying embodiments thereof, but can be varied within the scope of the following claims.

What is claimed is:

1. A method of wavelength locking and mode monitoring a tuneable laser that includes two or more tuneable sections in which injected current can be varied, said sections including at least one reflector section and one phase section, wherein the laser has been characterized with respect to suitable laser operation points that have been determined as different current combinations through the different laser sections, and wherein said laser operates in a predetermined, selected operation point, said method comprising the steps of:

detecting the light emitted by the laser with respect to its wavelength with the aid of a wavelength-selective filter; controlling the laser in an iterative process in which alternated currents through at least the reflector section of said laser and the current through the phase section of said laser are adjusted; adjusting the currents through at least the reflector section to obtain a minimum with respect to the ratio between rearwardly-emitted laser light power and forwardly-emitted laser light; and adjusting the current through the phase section of the laser to hold the wavelength constant, said wavelength being measured against a wavelength reference.

2. A method according to claim 1, wherein the wavelength reference includes a Fabry-Perot filter which has a given transmission for each wavelength included in a channel plane that contains desired wavelengths, and has in respect of other wavelengths a transmission which deviates from said desired wavelengths.

3. A method according to claim 1, including the steps of: leading part of the forwardly-emitted laser light to a first detector on the one hand and to a second detector via a Fabry-Perot filter on the other hand; measuring the rearwardly-emitted laser light with a monitor diode placed adjacent a rear mirror of the laser, said detectors being adapted to measure the power of the light and to deliver a corresponding detector signal; adjusting the currents through at least the reflector section so that the ratio between the detector signal from the monitor diode and the detector signal from the first detector is a minimum value; and adjusting the current through the phase section so that the ratio between the detector signal from the second detector and the detector signal from the first detector is within a predetermined range, so that the emitted light will lie within one of a number of wavelengths given by the Fabry-Perot filter.

4. A method according to claim 3, including the step of: applying the signal from the first detector to a power regulating circuit to control the laser and cause said laser to emit light of a constant power as the respective currents are adjusted during the iterative process.

5. A method according to claim 1, including the steps of: calculating quotients between the initial currents and the current concerned with respect to respective tuning sections after adjusting the currents through said tuning sections so that the laser will emit the wavelength set initially while, at the same time, lasing in the mode initially set; and using the calculated quotients to rescale the currents of all other operation points and therewith give adjusted operation points.

6. A method according to claim 1, including the step of adjusting currents applied to a coupler section of the laser.

7. A method according to claim 6, wherein the wavelength reference includes a Fabry-Perot filter which has a given transmission for each wavelength included in a channel plane that contains desired wavelengths, and has in respect of other wavelengths a transmission which deviates from said desired wavelengths.

8. A method according to claim 6, including the steps of: leading part of the forwardly-emitted laser light to a first detector on the one hand and to a second detector via a Fabry-Perot filter on the other hand; measuring the rearwardly-emitted laser light with a monitor diode placed adjacent a rear mirror of the laser, said detectors being adapted to measure the power of the light and to deliver a corresponding detector signal; adjusting the currents through the reflector section and through the coupler section so that the ratio between the detector signal from the monitor diode and the detector signal from the first detector is a minimum value; and adjusting the current through the phase section so that the ratio between the detector signal from the second detector and the detector signal from the first detector is within a predetermined range, so that the emitted light will lie within one of a number of wavelengths given by the Fabry-Perot filter.

9. A method according to claim 8, including the step of: applying the signal from the first detector to a power regulating circuit to control the laser and cause said laser to emit light of a constant power as the respective currents are adjusted during the iterative process.

10. A method according to claim 6, including the steps of: calculating quotients between the initial currents and the current concerned with respect to respective tuning sections after adjusting the currents through said tuning sections so that the laser will emit the wavelength set initially while, at the same time, lasing in the mode initially set; and using the calculated quotients to rescale the currents of all other operation points and therewith give adjusted operation points.

* * * * *